United States Patent
Ho et al.

(10) Patent No.: US 10,838,304 B2
(45) Date of Patent: Nov. 17, 2020

(54) PRIMING MATERIAL FOR ORGANOMETALLIC RESIST

(71) Applicant: Taiwan Semiconductor Manufacturing Co., Ltd., Hsin-Chu (TW)

(72) Inventors: Chun-Chih Ho, Taichung (TW); An-Ren Zi, Hsinchu (TW); Ching-Yu Chang, Yilang County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 165 days.

(21) Appl. No.: 16/101,760

(22) Filed: Aug. 13, 2018

(65) Prior Publication Data

US 2020/0050109 A1     Feb. 13, 2020

(51) Int. Cl.
| | |
|---|---|
| G03F 7/16 | (2006.01) |
| G03F 7/004 | (2006.01) |
| G03F 7/11 | (2006.01) |
| H01L 21/687 | (2006.01) |
| H01L 21/027 | (2006.01) |

(52) U.S. Cl.
CPC ............ *G03F 7/162* (2013.01); *G03F 7/0042* (2013.01); *G03F 7/11* (2013.01); *G03F 7/168* (2013.01); *H01L 21/0274* (2013.01); *H01L 21/68764* (2013.01)

(58) Field of Classification Search
CPC ..... G03F 7/40; G03F 7/38; G03F 7/20; G03F 7/168; G03F 7/11; G03F 7/0042–0043
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,310,684 B2* | 4/2016 | Meyers | G03F 7/20 |
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 2002/0016431 A1* | 2/2002 | Iwasa | C08F 220/30 |
| | | | 526/284 |
| 2002/0076495 A1* | 6/2002 | Maloney | G03F 7/0042 |
| | | | 427/272 |

(Continued)

OTHER PUBLICATIONS

Moran-Mirabal, Jose, Piranha Cleaning _ Glass Surfaces, obtained from the internet , Moran MIrabal Group, date May 2014, three pages. (Year: 2014).*

(Continued)

*Primary Examiner* — Cynthia Hamilton
(74) *Attorney, Agent, or Firm* — Haynes and Boone, LLP

(57) ABSTRACT

Semiconductor systems and methods are provided. In an embodiment, a method of film formation includes receiving a substrate, dispensing a priming material on the substrate, and applying an organometallic resist solution over the priming material on the substrate, thereby forming an organometallic resist layer over the priming material. The priming material includes water.

20 Claims, 8 Drawing Sheets

(56) References Cited

U.S. PATENT DOCUMENTS

| | | | |
|---|---|---|---|
| 2011/0293888 A1* | 12/2011 | Stowers | G03F 7/0042 |
| | | | 428/141 |
| 2016/0202610 A1* | 7/2016 | Lee | H01L 21/02087 |
| | | | 438/674 |
| 2016/0276151 A1* | 9/2016 | Liu | G03F 7/162 |
| 2019/0086818 A1* | 3/2019 | Zi | G03F 7/168 |
| 2019/0096675 A1* | 3/2019 | Zi | H01L 21/266 |

OTHER PUBLICATIONS

NASA Jet Propulsion Laboratory, California Institute of Technology, Ocean Surface Topagraphy from Space, Overview , Phiscal properties of Air, two pages downloaded from internet Mar. 2020. (Year: 2020).*

* cited by examiner

PRIMING MATERIAL FOR ORGANOMETALLIC RESIST

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

Resists are used to pattern different layers in IC device fabrication processes. A resist solution is first spin-coated on a substrate to form a resist layer. The resist layer is then exposed to a radiation source to form a latent pattern such that the exposed area and the unexposed area have different solubility in a developer. The different solubility allows the resist layer to be patterned based on the latent patent in a developing process that includes a post exposure bake step. For example, resists that contain organometallic compounds are used with extreme ultraviolet (EUV) radiation sources and the organometallic compounds and water may undergo condensation reactions accelerated by the EUV radiation. In those examples, water is introduced into the resist layer by way of moisture in ambient air at the post exposure bake step.

However, while existing resist coating and developing techniques have been generally adequate, the potential for future improvements still exists. For example, footing resulted from reduced radiation intensity near the bottom of the resist layer may still be improved.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
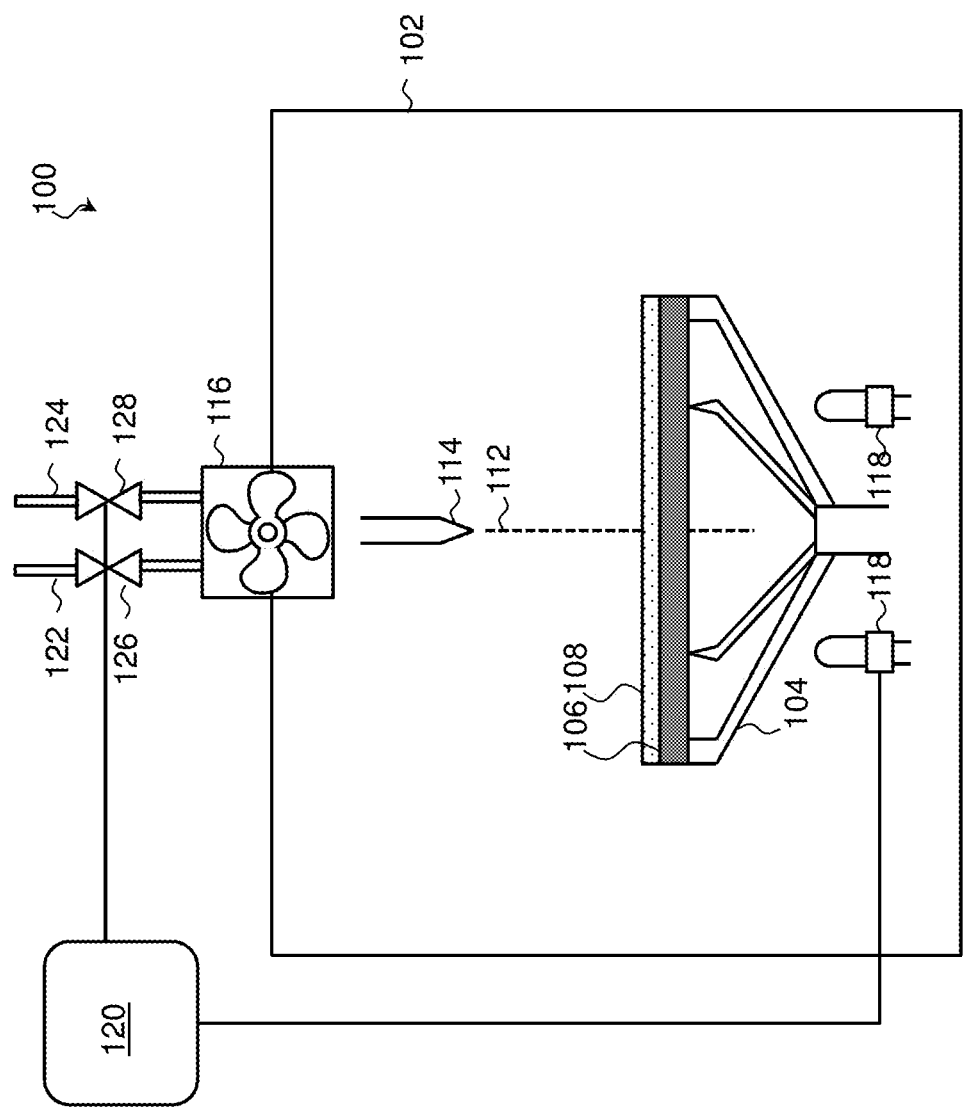
FIG. 1A is a side view of a substrate being coated with a priming material in a spin coating system according to various aspects of the present disclosure.

The present disclosure relates generally to IC device manufacturing and, more particularly, to techniques of applying a priming material and forming a resist layer to compensate for radiation intensity variation across a thickness of the resist layer.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 1B:
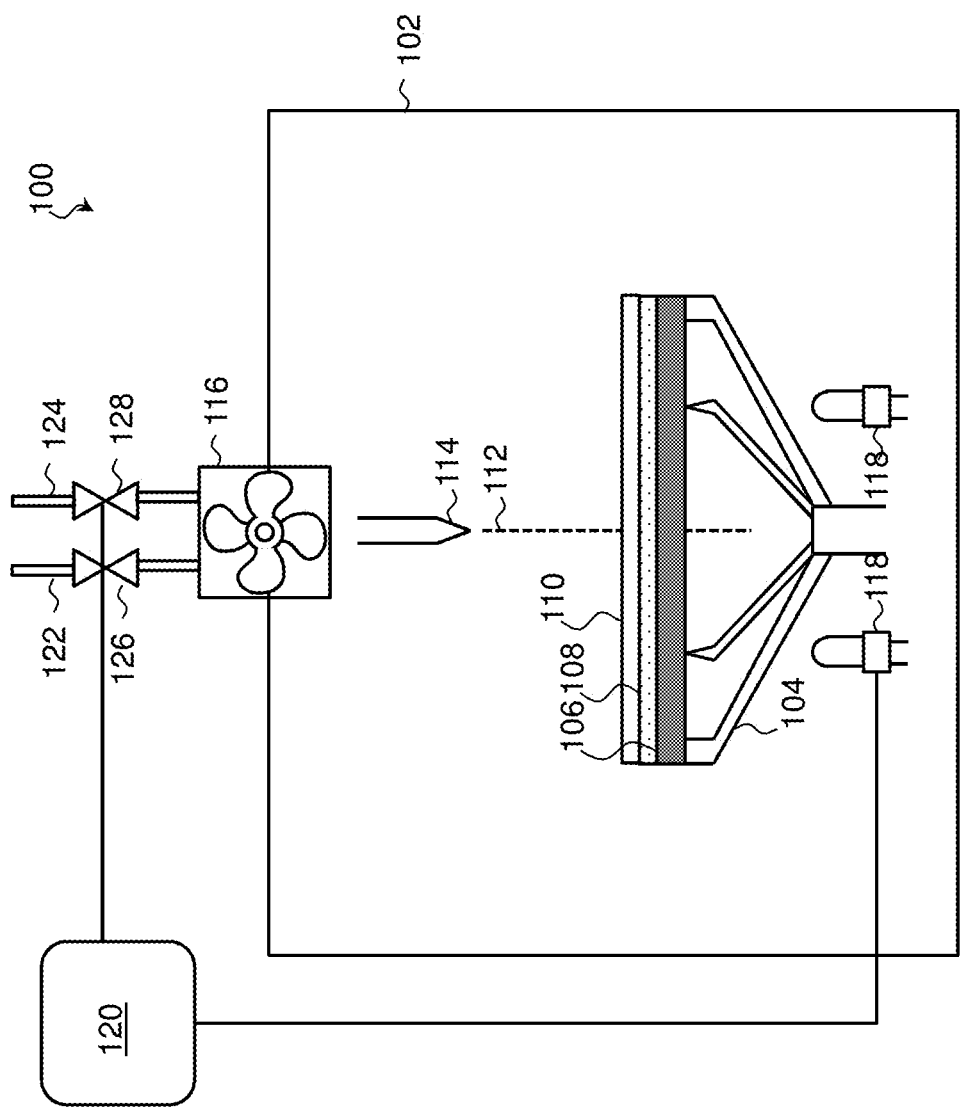
FIG. 1B is a side view of a substrate being coated with a resist layer in a spin coating system according to various aspects of the present disclosure.

The present disclosure relates to techniques of applying a priming material to a work piece, such as a semiconductor substrate, for providing a water concentration gradient within a resist layer formed on the priming material. An example of a spin coating system 100 suitable for performing these techniques is described with reference to FIGS. 1A and 1B. In that regard, FIGS. 1A and 1B are side views of the spin coating system 100 according to various aspects of the present disclosure. In FIG. 1A, a priming material 108 is applied to a substrate 106 (or workpiece 106). In FIG. 1B, a resist layer 110 is formed on the priming material 108. For clarity and ease of explanation, some elements of the figures have been simplified.

The spin coating system 100 utilizes the rotation of the substrate 106 to distribute a liquid across the surface. In some embodiments, in order to efficiently control the ambient condition in which the spin coating process is performed, the spin coating system 100 may include a chamber 102 to house the substrate 106. Accordingly, the spin coating system 100 may include a rotating chuck 104 operable to retain and rotate the substrate 106. The chuck 104 may use any method to retain the substrate 106, and in some exemplary embodiments, the chuck 104 is a vacuum chuck. Accordingly, in the illustrated embodiment, a central cavity within the chuck 104 is connected to a vacuum pump. The chuck 104 is sealed against a back surface of the substrate 106, and air within the cavity is evacuated to hold the substrate 106 in place.

Once the substrate 106 is secured, the chuck 104 rotates around a central axis 112 causing the retained substrate 106 to rotate as well. Because of increased turbulence and rotational instability, maximum rotational speeds for larger wafers tend to be slower. The rotational speed of the chuck 104 (and by extension the substrate 106) may vary throughout the spin coating technique in order to control the dispersal of the liquid being applied.

To supply the liquid, the spin coating system 100 may include one or more nozzles 114. In addition to one or more nozzles 114, the spin coating system 100 may include a downdraft air flow device 116 (or air flow device 116) that directs air or inert gas towards the surface of the substrate 106 upon which the priming material 108 is being applied. In some embodiments, the downdraft air flow device 116 may blow ambient air from source 122 or an inert gas from source 124 at the surface of the substrate 106. The inert gas from the source 124 may include nitrogen, argon, and/or helium. In some embodiments, the spin coating system 100 may include a controller 120. The controller 120 may be configured to control and modulate flow of the air from the source 122 into the chamber 102 by governing a degree of opening of a valve 126. Similarly, the controller 120 may be configured to control and modulate flow of the inert gas from the source 124 into the chamber 102 by governing a degree of opening of a valve 128. In some implementations, the source 122 is a tank of saturated air and the water content of the saturated air may be controlled by temperature. The air provided by the downdraft air flow device 116 may be heated in order to control viscosity, water content, amount, evaporation, and/or solidification of the liquids provided on the substrate. In that regard, some degree of evaporation during the application process may be desirable in order to produce thicker films, while over drying may prevent the liquid from fully covering the substrate 106 before solidifying.

To further control evaporation, the spin coating system 100 may include one or more heating elements 118 controlled by the controller 120 to maintain the substrate 106 and any liquids disposed thereupon at a designated temperature. In some examples, the heating elements 118 are controlled by the controller 120 according to a complex thermal profile that varies the substrate 106 temperature throughout the spin coating process. As with the downdraft air flow device 116, the heating elements 118 may be used to control ambient temperature and thereby control viscosity, water content, amount, evaporation, and/or solidification of the liquids provided on the substrate 106.

As the substrate 106 rotates, some liquid dispersed on the substrate 106 may be ejected from the substrate 106. Much of the ejected liquid will come from the circumferential edge of the substrate 106, although some liquid will be ejected elsewhere along the surface of the substrate 106. To reduce consumption of a resist solution used to form the resist layer 110 in FIG. 1B, the priming material 108 shown in FIG. 1A is applied to the substrate 106 to improve wetting of the resist solution on the substrate 106. In some embodiments, when the priming material 108 is applied to the substrate 106 in FIG. 1A, the controller 120 operates to open the valve 126 and close the valve 128, resulting in air from the source 122 blown into the chamber 102 by the downdraft air flow device 116. In embodiments where the source 122 is a reservoir or tank of saturated air, the air from the source 122 may have a relative humidity of between about 20% and about 80%. The humidity of the air from the source 122 may be put in contact with the priming material 108 as the priming material 108 is being applied to the substrate 106. In some instances, the priming material 108 may include ketones and alcohols that have certain affinity to water, resulting in higher water contents in the priming material 108.

As shown in FIG. 1B, after the priming material 108 is applied to the substrate 106, the ambient humidity in the chamber 102 may be changed by the controller 120 when forming the resist layer 110. Because the air from the source 122 contains water and the inert gas from the source 124 is free of water, the controller 120 may control the ambient humidity by controlling the degree of opening of the valves 126 and 128. For example, the controller 120 may reduce the ambient humidity in the chamber 102 by reducing the degree of opening of the valve 126 and increase the flow of inert gas from the source 124 by increasing the degree of opening of the valve 128. In some instances, the controller 120 may completely shut off the valve 126 while leaving the valve 128 open such that the downdraft air flow device 116 is only blowing dry inert gas toward the surface of the substrate 106. In the embodiments shown in FIG. 1B, the resist layer 110 is formed when the controller 120 shuts off the valve 126 and opens the valve 128. The dry inert gas from the source 124 blown by the air flow device 116 toward the surface of the substrate 106 ensures that the chamber 102 is free of water when the resist layer 110 is formed. In some other instances, instead of completely shutting off the valve 126, the controller 120 may reduce the degree of opening of the valve 126 and allow limited amount of water enter the chamber 102 along with the saturated air from the source 122.

Being able to control the ambient humidity in the chamber 102 with the controller 120, the spin coating system 100 of the present disclosure may achieve several benefits. For example, by ensuring that the resist layer 110 is formed in a dry ambient, the resist layer 110 is free of water when formed. In some instances, the resist layer 110 may include an organometallic compound that includes a metallic core coordinated with a plurality of ligands. The metallic core may include tin (Sn), hafnium (Hf), zirconium (Zr), manganese (Mg), aluminum (Al), vanadium (V), titanium (Ti), chromium (Cr), cobalt (Co), nickel (Ni), copper (Cu), zinc (Zn), gallium (Ga), or iron (Fe). In an ideal setting, water and the organometallic compound do not undergo condensation reaction without being irradiated by an extreme ultraviolet (EUV) source. However, in reality, resist solutions containing organometallic compounds are stored water-free to prevent spontaneous condensation reaction with water. Similarly, in some implementations, providing a dry ambient in the chamber 102 when forming the resist layer 110 may help avoid spontaneous condensation reaction before the resist layer 110 is irradiated by the EUV source. Because the priming material 108 is applied in an ambient of saturated air, the priming material 108 includes water. When the resist layer 110 is being formed on the priming material 108, water in the priming material 108 may diffuse into the resist layer 110, resulting in a water concentration gradient across the thickness of the resist layer 110. In some embodiments, the water concentration in the resist layer 110 near the junction of the priming material 108 and the resist layer 110 is greater than the water concentration away from the priming material 108. Such a water concentration gradient may cause the resist layer 110 to have more water near the priming material 108 and less water near its surface which is opposite to the junction of the priming material 108 and the resist layer 110. When the resist layer 110 is irradiated by an EUV source in a later exposure process, the EUV radiation intensity is stronger near the surface of the resist layer 110 and weaker near the junction between the priming material 108 and the resist layer 110. The greater water content in the resist layer 110 near the priming material 108 may supply more reactant-water near the priming material 108 and therefore compensates the weaker EUV radiation intensity near the priming material 108. In some embodiments, the portion of the organometallic resist layer that is irradiated by the EUV source undergoes condensation reaction in a post exposure bake (PEB) process to form a latent pattern. The latent pattern is substantially insoluble in a developer. The portion of the organometallic resist layer that is not irradiated by the EUV source will not undergo condensation reaction in the PEB process and is soluble in the developer. The difference in solubility allows the latent pattern to be developed in a development process.

In some alternative implementations, the controller 120 may allow some saturated air from the source 122 into the chamber 102 when the resist layer 110 is being formed to provide a baseline water concentration in the resist layer 110. In some embodiments, the baseline water concentration in the resist layer 110 is lower than the water concentration in the priming material 108 such that a water concentration gradient is present across the thickness of the resist layer 110. In these alternative implementations, the higher water concentration in the priming material 108 may compensate the weaker EUV radiation intensity near the priming material 108. The amount of saturated air allowed into the chamber 102 when the resist layer 110 is being formed depends on the organometallic compound's propensity to undergo spontaneous condensation reaction without EUV radiation. When the organometallic compound in the resist layer 110 is prone to spontaneous condensation reaction, the ambient in the chamber 102 should be substantially dry when the resist layer 110 is being formed. That is, no water is intentionally introduced into the chamber 102. When the organometallic compound in the resist layer 110 is stable in the presence of water, the ambient in the chamber 102 may include more saturated air from the source 122.

Figure 2:
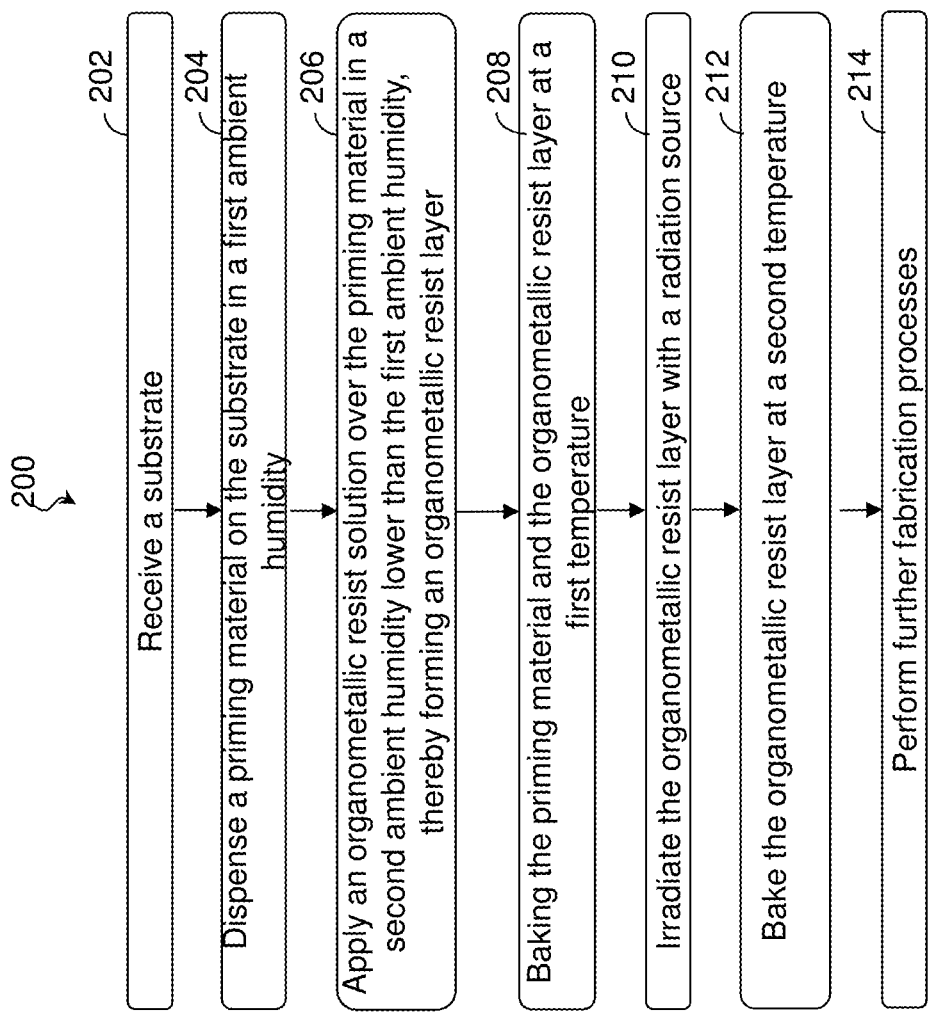
FIG. 2 is a flow diagram of a method for fabricating an integrated circuit (IC) device according to various aspects of the present disclosure.

FIG. 2 illustrates a flow diagram of a method 200 for fabricating an integrated circuit (IC) device according to various aspects of the present disclosure. The method 200 is merely an example, and is not intended to limit the present disclosure beyond what is explicitly recited in the claims. Additional operation may be provided before, during, and after the method 200, and some operations may be replaced, eliminated, or moved around for additional embodiments of the method 200. The method 200 will be described in conjunction with FIGS. 1A, 1B, 4, 5, 6, and 7.

Referring now to FIG. 1A, the method 200 of FIG. 2 begins at block 202 where a substrate or workpiece, such as the substrate 106 in FIG. 1A, is received. In some embodiments, the substrate 106 is secured to a wafer stage, such as the chuck 104 shown in FIG. 1A. In some implementations, the substrate 106 and the chuck 104 may be received within a chamber, such as the chamber 102 of the spin coating system 100 in FIG. 1A.

The method 200 then proceeds to block 204 where a priming material is dispensed on the substrate in a first ambient humidity. In some embodiments, the priming material may be the priming material 108 shown in FIG. 1A. In some embodiments, the priming material may include at least one solvent similar to or miscible with at least one solvent used in an organometallic resist solution used in block 206, which will be described in more detail below. In some implementations, the priming material may include one or more alcohols, one or more ketones, one or more ethers, one or more ether acetates, or a combination thereof. Examples of such alcohols include alcohols (A), (B), (C), (D), (E), (F), (G), (H), (I), (J), (K), and (L) illustrated in FIG. 6. Examples of such ketones include ketones (A), (B), (C), (D), (E), (F), (G), (H), (I), (J), (K), and (L) illustrated in FIG. 7. Other examples of such ketones include 3-heptanone, 4-heptanone, 6-methyl-2-heptanone, 6-ethyl-2-heptanone, 5-methyl-2-heptanone, 5-ethyl-2-heptanone, 4-methyl-2-heptanone, 4-ethyl-2-heptanone, 3-methyl-2-heptanone, 3-ethyl-2-heptanone, 2-methyl-3-heptanone, 2-ethyl-3-heptanone, 4-methyl-3-heptanone, 4-ethyl-3-heptanone, 5-methyl-3-heptanone, 5-ethyl-3-heptanone, 6-methyl-3-heptanone, 6-ethyl-3-heptanone, 2-methyl-4-heptanone, 2-ethyl-4-heptanone, 3-methyl-4-heptanone, and 3-ethyl-4-heptanone. Further other examples of such ketones include 2-octanone, 3-octanone, 4-octanone, 3-ethyl-2-octanone, 3-methyl-2-octanone, 4-ethyl-2-octanone, 4-methyl-2-octanone, 5-ethyl-2-octanone, 5-methyl-2-octanone, 6-ethyl-2-octanone, 6-methyl-2-octanone, 7-ethyl-2-octanone, 7-methyl-2-octanone, 2-ethyl-3-octanone, 2-methyl-3-octanone, 4-ethyl-3-octanone, 4-methyl-3-octanone, 5-ethyl-3-octanone, 5-methyl-3-octanone, 6-ethyl-3-octanone, 6-methyl-3-octanone, 7-ethyl-3-octanone, 7-methyl-3-octanone, 2-ethyl-4-octanone, 2-methyl-4-octanone, 3-ethyl-4-octanone, 3-methyl-4-octanone, 5-ethyl-4-octanone, 5-methyl-4-octanone, 6-ethyl-4-octanone, 6-methyl-4-octanone, 7-ethyl-4-octanone, and 7-methyl-4-octanone. Yet further other examples of such ketones include 2-nonanone, 3-nonanone, 4-nonanone, 5-nonanone, 3-methyl-2-nonanone, 3-ethyl-2-octanone, 4-methyl-2-nonanone, 4-ethyl-2-octanone, 5-methyl-2-nonanone, 5-ethyl-2-octanone, 6-methyl-2-nonanone, 6-ethyl-2-octanone, 7-methyl-2-nonanone, 7-ethyl-2-octanone, 8-methyl-2-nonanone, 8-ethyl-2-octanone, 2-methyl-3-nonanone, 2-ethyl-3-octanone, 4-methyl-3-nonanone, 4-ethyl-3-octanone, 5-methyl-3-nonanone, 5-ethyl-3-octanone, 6-methyl-3-nonanone, 6-ethyl-3-octanone, 7-methyl-3-nonanone, 7-ethyl-3-octanone, 8-methyl-3-nonanone, 8-ethyl-3-octanone, 2-methyl-4-nonanone, 2-ethyl-4-octanone, 3-methyl-4-nonanone, 3-ethyl-4-octanone, 5-methyl-4-nonanone, 5-ethyl-4-octanone, 6-methyl-4-nonanone, 6-ethyl-4-octanone, 7-methyl-4-nonanone, 7-ethyl-4-octanone, 8-methyl-4-nonanone, 8-ethyl-4-octanone, 2-methyl-5-nonanone, 2-ethyl-5-octanone, 3-methyl-5-nonanone, 3-ethyl-5-octanone, 4-methyl-5-nonanone, and 4-ethyl-5-octanone. An example of such ethers may be propylene glycol methyl ether (PGME). An example of such acetates may be propylene glycol methyl ether acetate (PGMEA). Because such alcohols and ketones illustrated in FIGS. 6 and 7 may form hydrogen bond with water, the priming material has affinity to water. In embodiments where the first ambient humidity is between about 20% and about 80%, water may diffuse into the priming material as the priming material is being dispensed on the substrate. In some instances, the first ambient humidity may be attained by blowing saturated air into the chamber by using the downdraft air flow device 116 in FIG. 1A. In embodiments where the spin coating system 100 in FIG. 1 is used, at block 204, the controller 120 may open the valve 126 so that the air from the source 122 may flow into the chamber 102 to provide humidity. In those embodiments, the controller 120 may or may not close the valve 128.

The method 200 then proceeds to block 206 where an organometallic resist solution is applied over the priming material in a second ambient humidity lower than the first ambient humidity, thereby forming an organometallic resist layer. In some embodiments, the organometallic resist solution may include at least one kind of organometallic compounds and at least one kind of solvents. In some implementations, the organometallic resist solution may include at least one kind of surfactant. In some embodiments, the at least one kind of organometallic compounds may include a metallic core coordinated with a plurality of ligands. The metallic core may include tin (Sn), hafnium (Hf), zirconium (Zr), manganese (Mg), aluminum (Al), vanadium (V), titanium (Ti), chromium (Cr), cobalt (Co), nickel (Ni), copper (Cu), zinc (Zn), gallium (Ga), or iron (Fe). In some implementations, the solvents in the organometallic resist solution can include alcohols and ketones. The second ambient humidity is lower than the first ambient humidity. In embodiments where the spin coating system 100 in FIG. 1 is used, at block 206, the controller 120 may reduce the flow through the valve 126 so that little or no air from the source 122 may flow into the chamber 102 to provide humidity. In these embodiments, the controller 120 may open the valve 128 so that inert gas from the source 124 may flow into the chamber 102 to provide dry ambient. Because the inert gas from the source 124 is drier than the saturated air from the source 122, the second ambient humidity is lower than the first ambient humidity.

Figure 4:
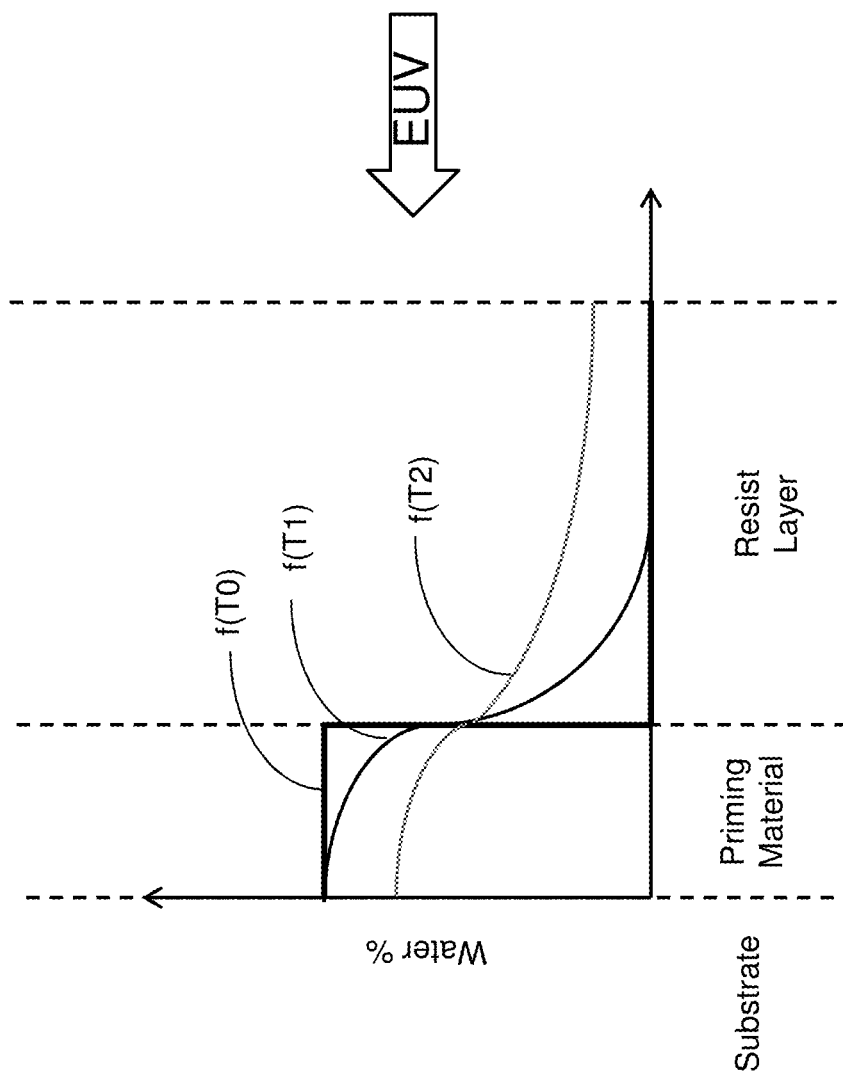
FIG. 4 illustrates water content gradients across a priming material and a resist layer according to various aspects of the present closure.

When the organometallic resist solution is applied to the priming material, water from the priming material may diffuse into the organometallic resist layer. Referring now to FIG. 4, illustrated therein are water content gradients across a priming material and a resist layer at different points in time. At T0, before the organometallic resist layer is formed on the priming material, the water content may be represented as a step function f(T0) because water is only present in the priming material. As organometallic resist solution is applied to the priming material in dry ambient at T1, water may diffuse from the priming material into the organometallic resist layer being formed. Thus, at T1, the water content in the priming material near the junction between the priming material and the organometallic resist layer starts to drop and the water content in the organometallic resist layer near the junction starts to increase, resulting in a water content gradient f(T1). Across the thickness of the organometallic resist layer, the water content adjacent the priming material is greater than that away from the priming material.

The method 200 then proceeds to block 208 where the priming material and the organometallic resist layer are baked at a first temperature. In some instances, the operations performed at block 208 may be referred to as a soft bake process. The purpose of this soft bake process includes reducing solvent contents, increasing adhesion, and preventing bubbling. In some embodiments, the first temperature is between about 80° C. and about 120° C. In some instances, the soft bake process at the block 208 causes water from the priming material to diffuse further into the organometallic resist layer. Referring now to FIG. 4, T2 may represent the point in time where the soft bake process is performed. At T2, the water content in the priming material drops further as more water diffuses into the organometallic resist layer, resulting in a water content gradient f(T2). While the water content in the organometallic resist layer is still greater near the priming material and lower away from the priming material, the difference therebetween is substantially less than that of the water content gradient f(T1).

The method 200 then proceeds to block 210 where the organometallic resist layer is irradiated with a radiation source. In some embodiments, the radiation source is an extreme ultraviolet (EUV) source and the irradiation of the organometallic resist layer may initiate or accelerate a condensation reaction between the organometallic compound and water. Referring now to FIG. 4, when the organometallic resist layer is irradiated by the EUV source, the radiation intensity is the strongest near the surface of the organometallic resist layer and becomes weaker along the thickness of the organometallic resist layer. Irradiating the organometallic resist layer with the EUV source may form a latent pattern in the organometallic resist layer.

Figure 5:
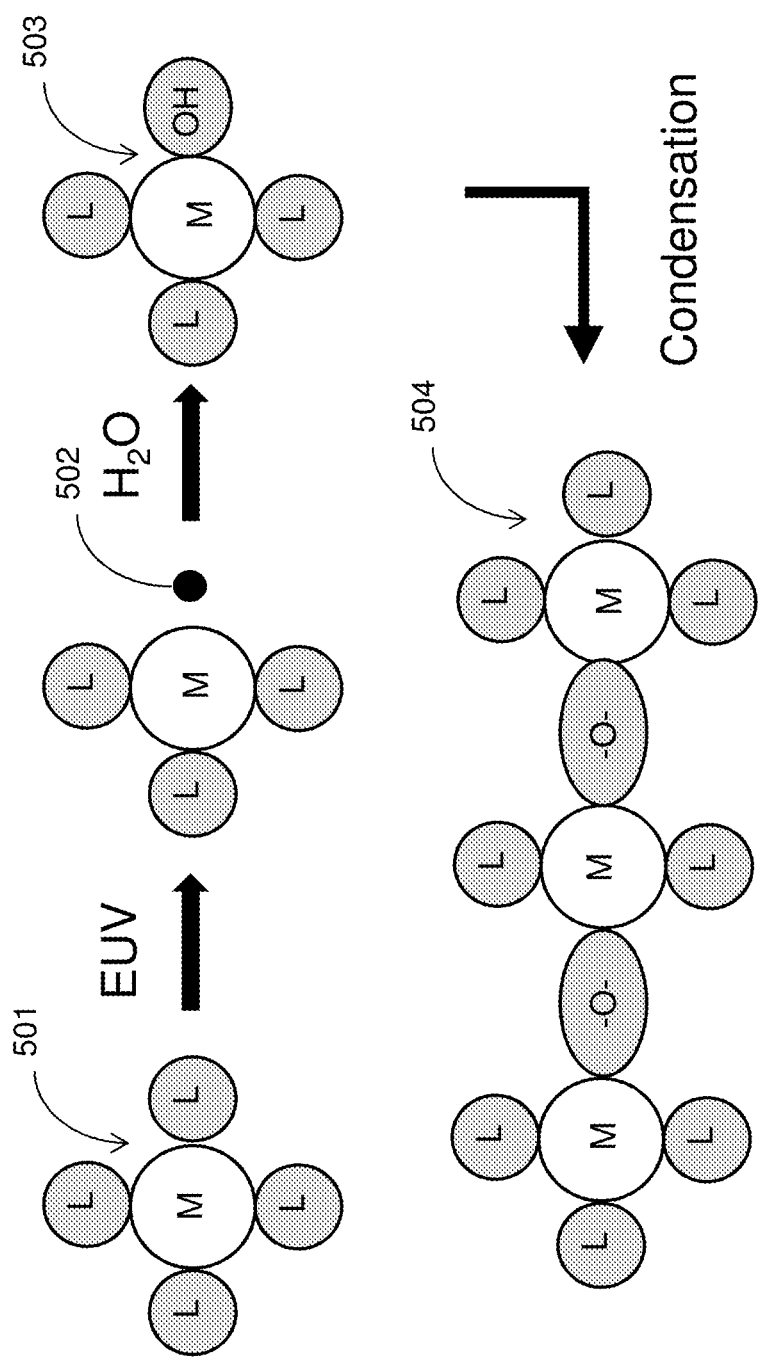
FIG. 5 illustrates the reactants, intermediates, and products of a condensation reaction of water and an organometallic compound according to various aspects of the present disclosure.
Figure 6:
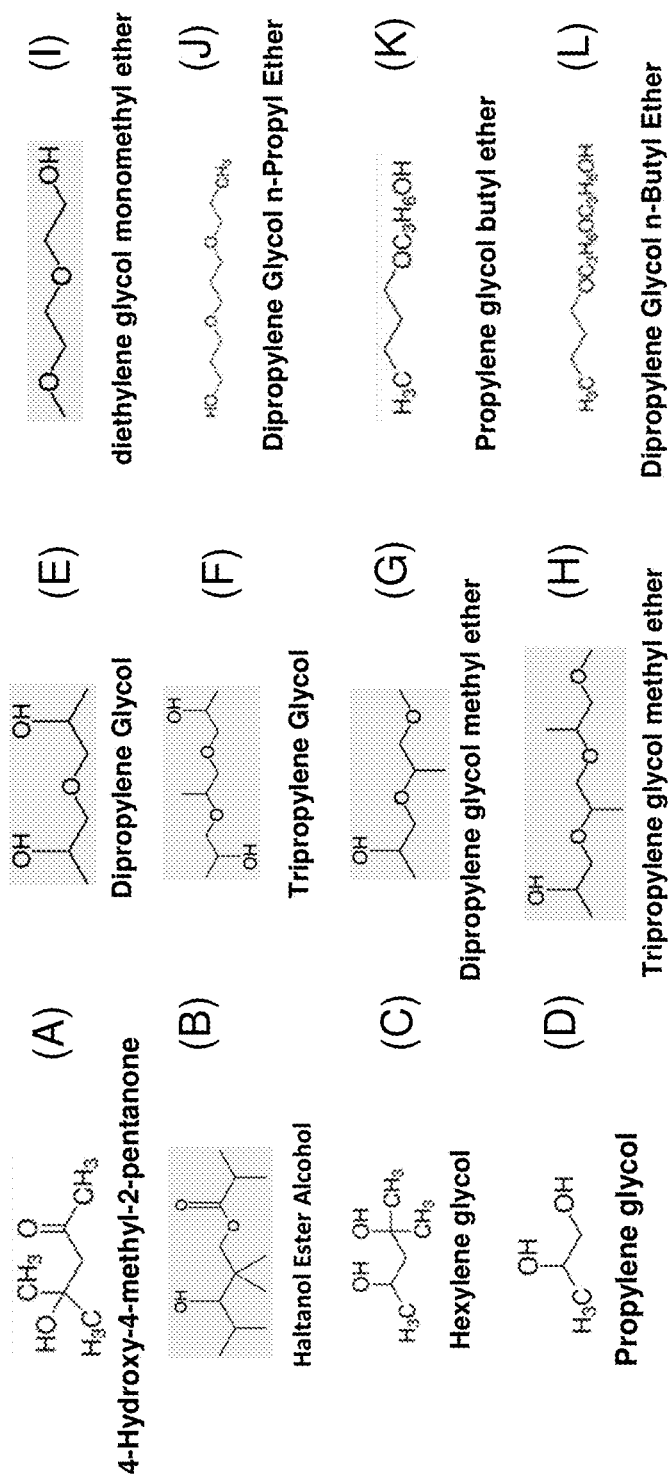
FIG. 6 illustrates molecular formulae of alcohols in a priming material, according to various aspects of the present disclosure.
Figure 7:
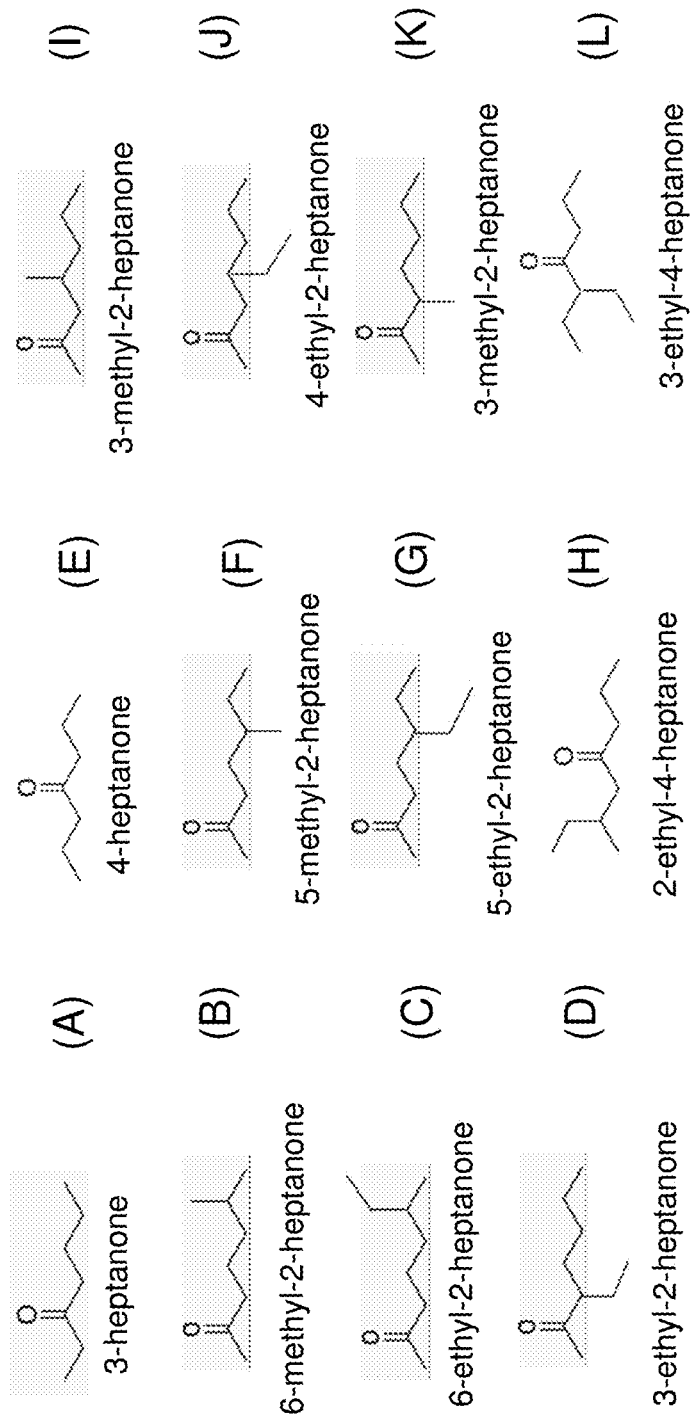
FIG. 7 illustrates molecular formulae of ketones in a priming material, according to various aspects of the present disclosure.

The method 200 then proceeds to block 212 where the organometallic resist layer is baked at a second temperature. Depending on the process conditions and properties/compositions of the organometallic resist solution, the second temperature may be either higher or lower than the first temperature. In some embodiments, the second temperature is between about 70° C. and about 220° C. In some embodiments, the second temperature is between about 160° C. and about 200° C. In some instances, the operations performed at the block 212 may be referred to as a post-exposure bake (PEB) process. Referring now to FIG. 5, an organometallic compound in the organometallic resist solution may be represented by a compound 501. The compound 501 includes a core, represented by "M," coordinated to a plurality of ligands "L." It is noted that while the core is shown to coordinate with four ligands, coordination with less or more ligands is envisioned. As shown in FIG. 5, when the compound 501 is irradiated by EUV, a radical or reaction site 502 may be generated. When the radical or the reaction site 502 is exposed to water during the PEB process, a hydroxyl group may replace one of the ligands and bond with the core M, resulting in a compound 503. More than one compound 503 may undergo a condensation reaction during the PEB process to form an organometallic polymer 504. It is noted that while the organometallic polymer 504 includes three monomer compounds 501, organometallic polymers with less or more monomer compounds 501 are envisioned. In this regard, the uneven radiation intensity across the thickness of the organometallic resist layer may be compensated by the water content gradient in the organometallic resist layer, such as the water content gradient f(T2) in FIG. 4. In this way, the organometallic compound near the surface of the organometallic resist layer receives stronger EUV radiation but less water, while the organometallic compound near the priming material receives weaker EUV radiation but more water. This arrangement helps to prevent footing due to reduced radiation intensity near the priming material. Because water is a reactant that plays a role in the condensation reaction, the presence of water may lower the exposure energy required to initiate the condensation reaction.

The portion of the organometallic resist layer that is irradiated by the EUV source at block 210 undergoes condensation reaction in the PEB process at block 212 to form organometallic polymers while the portion that is not irradiated by the EUV source at block 210 does not under condensation reaction at block 212. The portion that is irradiated by the EUV source may constitute a latent pattern. As the organometallic polymers are substantially insoluble in a developer used in a later development process, the portion that is irradiated by the EUV source is substantially insoluble in the developer. The portion that is not irradiated by the EUV source does not undergo condensation reaction at block 212 and is soluble in the developer. The difference in solubility allows the latent pattern to be developed in the development process.

The method 200 then proceeds to block 214 where further fabrication processes are performed. Further fabrication processes may include any suitable etching process, deposition process, implantation process, epitaxy process, and/or any other fabrication process to be performed to the substrate or workpiece, such as the substrate 106 in FIG. 1B. In various examples, the organometallic resist layer may be used to fabricate a gate stack, to fabricate an interconnect structure, to form non-planar devices by etching to expose a fin or by epitaxially growing fin material, and/or other suitable applications. For example, the substrate and the organometallic resist layer may be used to fabricate an integrated circuit chip, a system on a chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Figure 3:
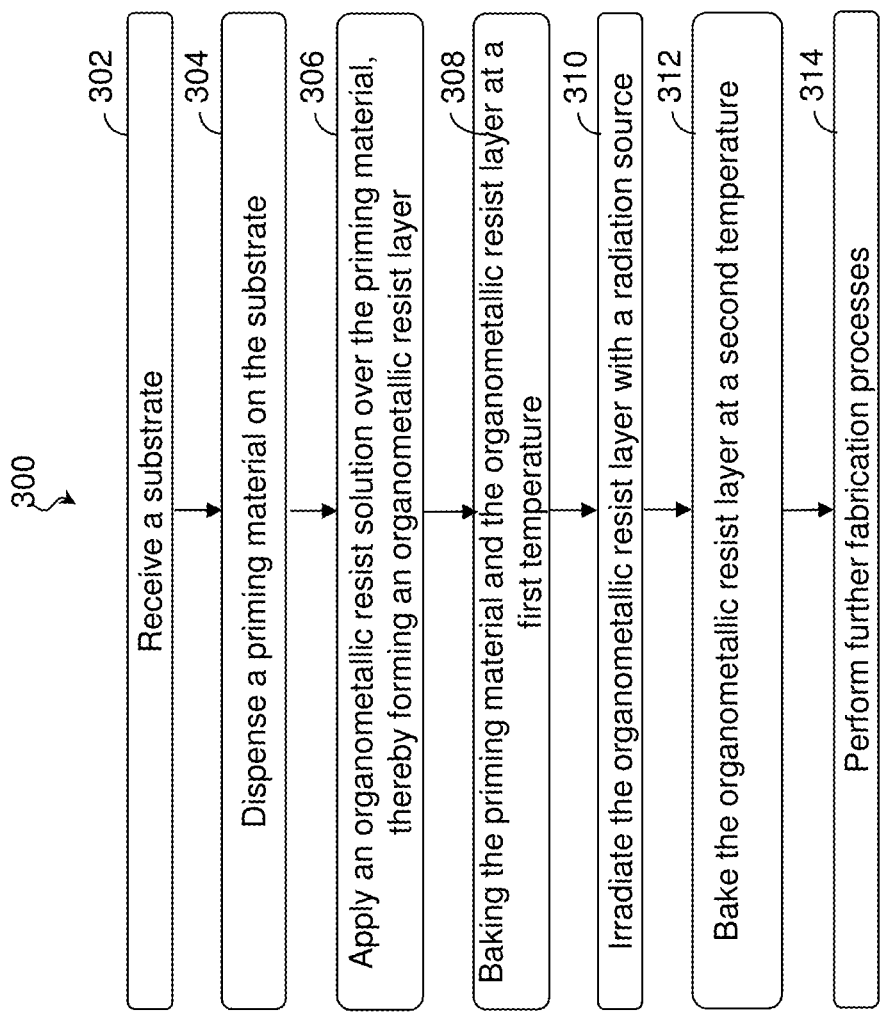
FIG. 3 is a flow diagram of a method for fabricating an integrated circuit (IC) device according to various aspects of the present disclosure.

FIG. 3 illustrates a flow diagram of a method 300 for fabricating an integrated circuit (IC) device according to various aspect of the present disclosure. The method 300 is merely an example, and is not intended to limit the present disclosure beyond what is explicitly recited in the claims. Additional operation may be provided before, during, and after the method 300, and some operations may be replaced, eliminated, or moved around for additional embodiments of the method 300. The method 300 will be described in conjunction with FIGS. 1A, 1B, 4, 5, 6, and 7.

Referring now to FIG. 1A, the method 300 of FIG. 3 begins at block 302 where a substrate or workpiece, such as the substrate 106 in FIG. 1A, is received. In some embodiments, the substrate 106 is secured to a wafer stage, such as the chuck 104 shown in FIG. 1A. In some implementations, the substrate 106 and the chuck 104 may be received within a chamber, such as the chamber 102 of the spin coating system 100 in FIG. 1A.

The method 300 then proceeds to block 304 where a priming material is dispensed on the substrate. The priming material includes water. In some embodiments, the priming material includes between about 0.1% and about 10% of water. Too high a water content in the priming material may adversely impact the wetting properties of the priming material. The water content in the priming material may be adjusted based on the reactivity of organometallic compound and radiation energy. In some implementations, the priming material may include one or more alcohols, one or more ketones, one or more ethers, one or more ether acetates, or a combination thereof. Examples of such alcohols include alcohols (A), (B), (C), (D), (E), (F), (G), (H), (I), (J), (K), and (L) illustrated in FIG. 6. Examples of such ketones include ketones (A), (B), (C), (D), (E), (F), (G), (H), (I), (J), (K), and (L) illustrated in FIG. 7. Other examples of such ketones include 3-heptanone, 4-heptanone, 6-methyl-2-heptanone, 6-ethyl-2-heptanone, 5-methyl-2-heptanone, 5-ethyl-2-heptanone, 4-methyl-2-heptanone, 4-ethyl-2-heptanone, 3-methyl-2-heptanone, 3-ethyl-2-heptanone, 2-methyl-3-heptanone, 2-ethyl-3-heptanone, 4-methyl-3-heptanone, 4-ethyl-3-heptanone, 5-methyl-3-heptanone, 5-ethyl-3-heptanone, 6-methyl-3-heptanone, 6-ethyl-3-heptanone, 2-methyl-4-heptanone, 2-ethyl-4-heptanone, 3-methyl-4-heptanone, and 3-ethyl-4-heptanone. Further other examples of such ketones include 2-octanone, 3-octanone, 4-octanone, 3-ethyl-2-octanone, 3-methyl-2-octanone, 4-ethyl-2-octanone, 4-methyl-2-octanone, 5-ethyl-2-octanone, 5-methyl-2-octanone, 6-ethyl-2-octanone, 6-methyl-2-octanone, 7-ethyl-2-octanone, 7-methyl-2-octanone, 2-ethyl-3-octanone, 2-methyl-3-octanone, 4-ethyl-3-octanone, 4-methyl-3-octanone, 5-ethyl-3-octanone, 5-methyl-3-octanone, 6-ethyl-3-octanone, 6-methyl-3-octanone, 7-ethyl-3-octanone, 7-methyl-3-octanone, 2-ethyl-4-octanone, 2-methyl-4-octanone, 3-ethyl-4-octanone, 3-methyl-4-octanone, 5-ethyl-4-octanone, 5-methyl-4-octanone, 6-ethyl-4-octanone, 6-methyl-4-octanone, 7-ethyl-4-octanone, and 7-methyl-4-octanone. Yet further other examples of such ketones include 2-nonanone, 3-nonanone, 4-nonanone, 5-nonanone, 3-methyl-2-nonanone, 3-ethyl-2-octanone, 4-methyl-2-nonanone, 4-ethyl-2-octanone, 5-methyl-2-nonanone, 5-ethyl-2-octanone, 6-methyl-2-nonanone, 6-ethyl-2-octanone, 7-methyl-2-nonanone, 7-ethyl-2-octanone, 8-methyl-2-nonanone, 8-ethyl-2-octanone, 2-methyl-3-nonanone, 2-ethyl-3-octanone, 4-methyl-3-nonanone, 4-ethyl-3-octanone, 5-methyl-3-nonanone, 5-ethyl-3-octanone, 6-methyl-3-nonanone, 6-ethyl-3-octanone, 7-methyl-3-nonanone, 7-ethyl-3-octanone, 8-methyl-3-nonanone, 8-ethyl-3-octanone, 2-methyl-4-nonanone, 2-ethyl-4-octanone, 3-methyl-4-nonanone, 3-ethyl-4-octanone, 5-methyl-4-nonanone, 5-ethyl-4-octanone, 6-methyl-4-nonanone, 6-ethyl-4-octanone, 7-methyl-4-nonanone, 7-ethyl-4-octanone, 8-methyl-4-nonanone, 8-ethyl-4-octanone, 2-methyl-5-nonanone, 2-ethyl-5-octanone, 3-methyl-5-nonanone, 3-ethyl-5-octanone, 4-methyl-5-nonanone, and 4-ethyl-5-octanone. An example of such ethers may be propylene glycol methyl ether (PGME). An example of such acetates may be propylene glycol methyl ether acetate (PGMEA).

The method 300 then proceeds to block 306 where an organometallic resist solution is applied over the priming material, thereby forming an organometallic resist layer. In some embodiments, the organometallic resist solution may include at least one kind of organometallic compounds and one or more kinds of solvents. In some implementations, the organometallic resist solution may include one or more kinds of surfactants. In some embodiments, the at least one kind of organometallic compound may include a metallic core coordinated with a plurality of ligands. The metallic core may include tin (Sn), hafnium (Hf), zirconium (Zr), manganese (Mg), aluminum (Al), vanadium (V), titanium (Ti), chromium (Cr), cobalt (Co), nickel (Ni), copper (Cu), zinc (Zn), gallium (Ga), or iron (Fe). In some implementations, the solvents in the organometallic resist solution may include alcohols and ketones. Different from the priming material, the organometallic resist solution is free of water or has a water content lower than that of the priming material. This is so because putting water in the organometallic resist solution or, in some cases, too much water in the organometallic resist solution may cause spontaneous condensation reaction even when the organometallic resist solution is not exposed to a radiation source. To prolong shelf life of the organometallic resist solution, the organometallic resist solution is free of water coming off the shelf. In embodiments where water is introduced into the organometallic resist solution, water may be added into the organometallic resist solution right before or during its application over the priming material. When water is added into the organometallic resist solution right before its application over the priming material, water may be added in its liquid form by, for example, titration. When water is added into the organometallic solution during its application over the priming material, water may be introduced by ambient moisture.

When the organometallic resist solution is applied over the priming material, water from the priming material may diffuse into the organometallic resist layer. Referring now to FIG. 4, illustrated therein are water content gradients across a priming material and a resist layer at different points in time. At T0, before the organometallic resist layer is formed on the priming material, the water content may be represented as a step function f(T0) because water is only present in the priming material. As organometallic resist solution is applied to the priming material in dry ambient at T1, water may diffuse from the priming material into the organometallic resist layer being formed. Thus, at T1, the water content in the priming material starts to drop near the junction between the priming material and the organometallic resist layer and the water content in the organometallic resist layer near the junction starts to increase, resulting in a water content gradient f(T1). Across the thickness of the organometallic resist layer, the water content adjacent the priming material is greater than that away from the priming material.

The method 300 then proceeds to block 308 where the priming material and the organometallic resist layer are baked at a first temperature. In some instances, the operations performed at block 308 may be referred to as a soft bake process. The purpose of this soft bake process includes reducing solvent contents, increasing adhesion, and preventing bubbling. In some embodiments, the first temperature is between about 80° C. and about 120° C. In some instances, the soft bake process at the block 308 causes water from the priming material to diffuse further into the organometallic resist layer. Referring now to FIG. 4, T2 may represent the point in time where the soft bake process is performed. At T2, the water content in the priming material drops further as more water diffuses into the organometallic resist layer, resulting in a water content gradient f(T2). While the water content in the organometallic resist layer is still greater near the priming material and lower away from the priming material, the different is less substantial as compared to the water content gradient f(T1).

The method 300 then proceeds to block 310 where the organometallic resist layer is irradiated with a radiation source. In some embodiments, the radiation source is an extreme ultraviolet (EUV) source and the irradiation of the organometallic resist layer may initiate or accelerate a condensation reaction between the organometallic compound and water. Referring now to FIG. 4, when the organometallic resist layer is irradiated by the EUV source, the radiation intensity is the strongest near the surface of the organometallic resist layer and becomes weaker along the thickness of the organometallic resist layer. Irradiating the organometallic resist layer with an EUV source may form a latent pattern in the organometallic resist layer.

The method 300 then proceeds to block 312 where the organometallic resist layer is baked at a second temperature. The second temperature may be either higher or lower than the first temperature. In some embodiments, the second temperature is between about 70° C. and about 220° C. In some embodiments, the second temperature is between about 160° C. and about 200° C. In some instances, the operations performed at the block 312 may be referred to as a post-exposure bake (PEB) process. Referring now to FIG. 5, an organometallic compound in the organometallic resist solution may be represented by a compound 501. The compound 501 includes a core, represented by "M," coordinated to a plurality of ligands "L." It noted that while the core is shown to coordinate with four ligands, coordination with less or more ligands is envisioned. As shown in FIG. 5, when the compound 501 is irradiated by EUV, a radical or reaction site 502 may be generated. When the radical or the reaction site 502 is exposed to water during the PEB process, a hydroxyl group may replace one of the ligands and bond with the core M, resulting in a compound 503. More than one compound 503 may undergo a condensation reaction during the PEB process to form an organometallic polymer 504. It is noted that while the organometallic polymer 504 includes three monomer compounds 501, organometallic polymers with less or more monomer compounds 501 are envisioned. In this regard, the uneven radiation intensity across the thickness of the organometallic resist layer may be compensated by the water content gradient in the organometallic resist layer, such as the water content gradient f(T2) in FIG. 4. This way, the organometallic compound near the surface of the organometallic resist layer receives stronger EUV radiation but less water, while the organometallic compound near the priming material receives weaker EUV radiation but more water. This arrangement helps to prevent footing due to reduced radiation intensity near the priming material. Because water is a reactant that plays a role in the condensation reaction, the presence of water may lower the exposure energy required to initiate the condensation reaction.

The portion of the organometallic resist layer that is irradiated by the EUV source at block 310 undergoes condensation reaction in the PEB process at block 312 to form organometallic polymers while the portion that is not irradiated by the EUV source at block 310 does not under condensation reaction at block 312. The portion that is irradiated by the EUV source may constitute a latent pattern. As the organometallic polymers are substantially insoluble in a developer used in a later development process, the portion that is irradiated by the EUV source is substantially insoluble in the developer. The portion that is not irradiated by the EUV source does not undergo condensation reaction at block 312 and is soluble in the developer. The difference in solubility allows the latent pattern to be developed in the development process.

The method 300 then proceeds to block 314 where further fabrication processes are performed. Further fabrication processes may include any suitable etching process, deposition process, implantation process, epitaxy process, and/or any other fabrication process to be performed to the substrate or workpiece, such as the substrate 106 in FIG. 1B. In various examples, the organometallic resist layer may be used to fabricate a gate stack, to fabricate an interconnect structure, to form non-planar devices by etching to expose a fin or by epitaxially growing fin material, and/or other suitable applications. For example, the substrate and the organometallic resist layer may be used to fabricate an integrated circuit chip, a system on a chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Thus, the present disclosure provides a spin coating technique and a priming material for compensating for reduced radiation intensity near a bottom of an organometallic resist layer. In some embodiments, a method of film formation includes receiving a substrate, dispensing a priming material on the substrate, and applying an organometallic resist solution over the priming material on the substrate, thereby forming an organometallic resist layer over the priming material. The priming material includes water.

In further embodiments, a method includes receiving a substrate; applying a priming material on the substrate, wherein the priming material comprises a compound; forming an organometallic resist layer on the priming material, wherein the organometallic resist layer comprises an organometallic compound; and irradiating the organometallic resist layer with an extreme ultraviolet (EUV) source to accelerate a condensation reaction of the compound and the organometallic compound.

In yet further embodiments, a method includes receiving a substrate; applying a priming material on the substrate in a first ambient humidity; forming an organometallic resist layer on the priming material in a second ambient humidity lower than the first ambient humidity, wherein the organometallic resist layer comprises an organometallic compound; and irradiating the organometallic resist layer with an extreme ultraviolet (EUV) source to accelerate a condensation reaction the organometallic compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of film formation, the method comprising:
receiving a substrate;
dispensing a priming material on the substrate, wherein the priming material comprises water; and
applying an organometallic resist solution over the priming material on the substrate, thereby forming an organometallic resist layer over the priming material.

2. The method of claim 1, further comprising:
baking the priming material and the organometallic resist layer at a first temperature;
irradiating the organometallic resist layer with a radiation source; and
baking the priming material and the organometallic resist layer at a second temperature different from the first temperature.

3. The method of claim 2, wherein the first temperature is between about 80° C. and about 120° C.

4. The method of claim 2, wherein the second temperature is greater than the first temperature.

5. The method of claim 2, wherein the radiation source is an extreme ultraviolet (EUV) source.

6. The method of claim 1, wherein the organometallic resist solution comprises an organometallic compound that includes tin (Sn), hafnium (Hf), zirconium (Zr), manganese (Mg), aluminum (Al), vanadium (V), titanium (Ti), chromium (Cr), cobalt (Co), nickel (Ni), copper (Cu), zinc (Zn), gallium (Ga), or iron (Fe).

7. The method of claim 1, wherein a water content of the organometallic resist layer is smaller than a water content of the priming material.

8. The method of claim 1, wherein the organometallic resist solution is free of water.

9. A method, comprising:
receiving a substrate;
applying a priming material on the substrate, wherein the priming material comprises a compound;
forming an organometallic resist layer on the priming material, wherein the organometallic resist layer comprises an organometallic compound; and
irradiating the organometallic resist layer with an extreme ultraviolet (EUV) source to accelerate a condensation reaction of the compound and the organometallic compound,
wherein the compound is water.

10. The method of claim 9, further comprising:
before the irradiating the organometallic resist layer with the EUV source, baking the priming material and the organometallic resist layer at a first temperature; and
after the irradiating the organometallic resist layer with the EUV source, baking the priming material and the organometallic resist layer at a second temperature greater than the first temperature,
wherein the irradiating the organometallic resist layer with the EUV source forms a latent pattern on the organometallic resist layer.

11. The method of claim 10, wherein the baking of the priming material and the organometallic resist layer at the first temperature generates a concentration gradient of the compound in the organometallic resist layer.

12. The method of claim 11, wherein the concentration gradient includes a first concentration near the priming material and a second concentration away from the priming material, wherein the first concentration is greater than the second concentration.

13. The method of claim 9, wherein the organometallic compound includes tin (Sn), hafnium (Hf), zirconium (Zr), manganese (Mg), aluminum (Al), vanadium (V), titanium (Ti), chromium (Cr), cobalt (Co), nickel (Ni), copper (Cu), zinc (Zn), gallium (Ga), or iron (Fe).

14. The method of claim 9, wherein the priming material comprises between about 0.1% and about 10% of water.

15. The method of claim 9, wherein the priming material further comprises a ketone or an alcohol.

16. The method of claim 9, wherein a water content of the organometallic resist layer is smaller than a water content of the priming material.

17. A method, comprising:
receiving a substrate;
applying a priming material on the substrate in a first ambient humidity;
forming an organometallic resist layer on the priming material in a second ambient humidity lower than the first ambient humidity, wherein the organometallic resist layer comprises an organometallic compound; and irradiating the organometallic resist layer with an extreme ultraviolet (EUV) source to accelerate a condensation reaction of the organometallic compound.

18. The method of claim 17, further comprising:
changing the first ambient humidity to the second ambient humidity.

19. The method of claim 17, wherein the applying of the priming material on the substrate in the first ambient humidity includes supplying saturated air to the substrate.

20. The method of claim 17,
wherein the first ambient humidity is between about 20% and about 80%, and
wherein the second ambient humidity is substantially 0%.

* * * * *